United States Patent
Zhang et al.

(10) Patent No.: US 8,003,454 B2
(45) Date of Patent: Aug. 23, 2011

(54) CMOS PROCESS WITH OPTIMIZED PMOS AND NMOS TRANSISTOR DEVICES

(75) Inventors: Da Zhang, Hopewell Junction, NY (US); Srikanth B. Samavedam, Fishkill, NY (US); Voon-Yew Thean, Austin, TX (US); Xiangdong Chen, Poughquag, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 612 days.

(21) Appl. No.: 12/125,855

(22) Filed: May 22, 2008

(65) Prior Publication Data
US 2009/0291540 A1   Nov. 26, 2009

(51) Int. Cl.
*H01L 21/336* (2006.01)
*H01L 21/337* (2006.01)

(52) U.S. Cl. ....................................... 438/197
(58) Field of Classification Search ............... None
See application file for complete search history.

(56) References Cited

U.S. PATENT DOCUMENTS

| | | | |
|---|---|---|---|
| 6,979,627 B2 | 12/2005 | Yeap et al. | |
| 7,018,901 B1 | 3/2006 | Thean et al. | |
| 7,029,980 B2 | 4/2006 | Liu et al. | |
| 7,041,576 B2 | 5/2006 | Pozder et al. | |
| 7,056,778 B2 | 6/2006 | Liu et al. | |
| 7,157,355 B2 | 1/2007 | Goktepeli | |
| 7,163,903 B2 | 1/2007 | Orlowski et al. | |
| 7,205,210 B2 | 4/2007 | Barr et al. | |
| 7,208,357 B2 | 4/2007 | Sadaka et al. | |
| 7,226,820 B2 | 6/2007 | Zhang et al. | |
| 7,238,561 B2 | 7/2007 | Zhang et al. | |
| 7,238,580 B2 | 7/2007 | Orlowski et al. | |
| 7,265,004 B2 | 9/2007 | Thean et al. | |
| 7,282,415 B2 | 10/2007 | Zhang et al. | |
| 7,364,953 B2 | 4/2008 | Dao | |
| 2005/0019967 A1* | 1/2005 | Ravi | 438/26 |
| 2005/0139936 A1* | 6/2005 | Li | 257/408 |
| 2006/0160317 A1 | 7/2006 | Zhu et al. | |
| 2007/0018205 A1 | 1/2007 | Chidambarrao et al. | |
| 2007/0082453 A1 | 4/2007 | Orlowski et al. | |
| 2007/0108481 A1 | 5/2007 | Thean et al. | |
| 2007/0152273 A1 | 7/2007 | Callegari et al. | |

(Continued)

OTHER PUBLICATIONS

E. Josse et al., A Cost Effective Low Power Platform for the 45-nm Technology Node, Electron Devices Meeting, IEDM '06 International, Dec. 11-13, 2006, pp. 1-4.

*Primary Examiner* — Ha Tran T Nguyen
*Assistant Examiner* — Valerie Brown
(74) *Attorney, Agent, or Firm* — Hamilton & Terrile, LLP; Michael Rocco Cannatti

(57) ABSTRACT

A semiconductor process and apparatus includes forming NMOS and PMOS transistors (24, 34) with enhanced hole mobility in the channel region of a transistor by selectively relaxing part of a biaxial-tensile strained semiconductor layer (90) in a PMOS device area (97) to form a relaxed semiconductor layer (91), and then epitaxially growing a bi-axially stressed silicon germanium channel region layer (22) prior to forming the NMOS and PMOS gate structures (26, 36) overlying the channel regions, and then depositing a contact etch stop layer (53-56) over the NMOS and PMOS gate structures. Embedded silicon germanium source/drain regions (84) may also be formed adjacent to the PMOS gate structure (70) to provide an additional uni-axial stress to the bi-axially stressed channel region.

20 Claims, 6 Drawing Sheets

U.S. PATENT DOCUMENTS

| | | |
|---|---|---|
| 2007/0184600 A1 | 8/2007 | Zhang et al. |
| 2007/0202651 A1 | 8/2007 | Zhang et al. |
| 2007/0224772 A1 | 9/2007 | Hall et al. |
| 2007/0238250 A1 | 10/2007 | Zhang et al. |
| 2007/0249113 A1 | 10/2007 | Grudowski et al. |
| 2007/0272952 A1 | 11/2007 | Thean et al. |
| 2008/0006880 A1 | 1/2008 | Orlowski et al. |
| 2008/0014688 A1* | 1/2008 | Thean et al. ............ 438/197 |
| 2008/0042215 A1 | 2/2008 | Ieong et al. |
| 2008/0258233 A1* | 10/2008 | Hsiao et al. ............ 257/382 |

* cited by examiner

CMOS PROCESS WITH OPTIMIZED PMOS AND NMOS TRANSISTOR DEVICES

BACKGROUND OF THE INVENTION

1. Field of the Invention

The present invention is directed in general to the field of semiconductor fabrication and integrated circuits. In one aspect, the present invention relates to complementary metal oxide semiconductor (CMOS) field effect transistors (FETs) fabricated with strained semiconductor channel regions

2. Description of the Related Art

CMOS devices, such as NMOS or PMOS transistors, have conventionally been fabricated on semiconductor wafers with NMOS and PMOS having same channel material characteristics. While it is possible to improve carrier mobility by intentionally stressing the channels of NMOS and/or PMOS transistors, it is difficult to simultaneously improve the carrier mobility for both types of devices formed on a uniformly-strained substrate because PMOS carrier mobility and NMOS carrier mobility are optimized under different types of stress. For example, those skilled in the art have discovered that electron mobility for NMOS devices having <110> channel oriented channels may be improved by intentionally implementing a tensile stress in NMOS transistor channels to improve carrier mobility, but <110> PMOS devices require a compressive channel stress for performance boosting. Moreover, stress conditions that optimize carrier mobility may negatively impact other device characteristics such as threshold voltage, thereby complicating the selection of stress conditions.

Accordingly, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
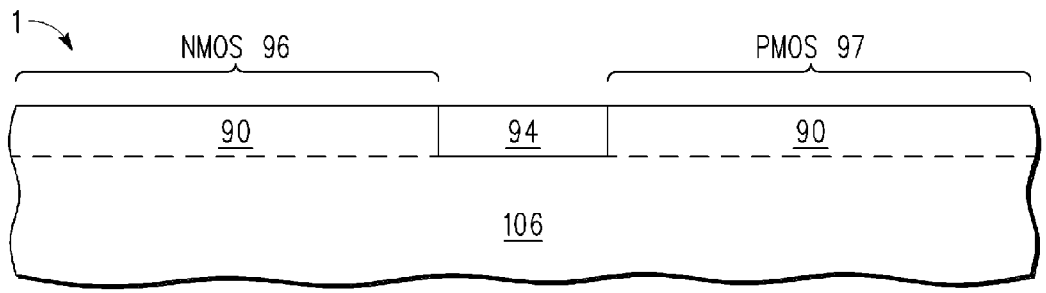
FIG. 1 is a partial cross-sectional view of a semiconductor wafer structure including a semiconductor layer having a first crystalline structure.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A semiconductor fabrication process and resulting integrated circuit are described for manufacturing high performance CMOS transistor devices on a semiconductor wafer substrate having a common channel orientation for both PMOS and NMOS devices by selectively controlling the channel stress conditions of the PMOS devices in a semiconductor wafer to produce an integrated circuit having stress conditions that are favorable for both NMOS and PMOS devices. In selected embodiments, a biaxially strained semiconductor layer (e.g., a silicon layer exhibiting biaxial tensile stress) having any desired channel orientation is formed as an active layer over a buried oxide layer and separated into NMOS and PMOS active layers by an isolation structure. After masking off the NMOS active layer, the PMOS active layer is relaxed, such as by implanting the PMOS active layer with silicon or xenon to relax the strained semiconductor layer in the PMOS region. On the relaxed PMOS active layer, a layer of biaxially compressive semiconductor, such as silicon germanium (SiGe), is epitaxially grown. PMOS transistor devices with improved mobility are formed over the compressively strained epitaxial active layer. Simultaneously, NMOS transistor devices are formed over the strained semiconductor layer in the NMOS area. In selected embodiments, additional differential stressing between the NMOS and PMOS active layers may be obtained by forming stress contact etch stop layers over the NMOS and PMOS transistor devices. Being fabricated on a biaxial-tensile strained substrate, the NMOS devices have improved carrier mobility. With a biaxially compressive channel SiGe formed over a relaxed PMOS active layer, a substantial enhancement in drive current is achieved as compared to PMOS devices formed on un-strained substrate. In other embodiments, PMOS device mobility may be further enhanced in a PFET transistor devices by growing an epitaxial layer of biaxially compressive silicon germanium (SiGe) on a relaxed PMOS active layer, and then forming a compressive stress contact etch stop layer over the PMOS transistor devices. In still further embodiments, PMOS device mobility may be further enhanced in a PFET transistor devices by growing an epitaxial layer of biaxially compressive silicon germanium (alone or in combination with epitaxially grown silicon carbide, silicon germanium doped with carbon, or other compound semiconductor of different Si, Ge, and C composition) on a relaxed PMOS active layer, and then forming embedded SiGe source/drain regions by epitaxially growing SiGe in source/drain recesses. By controlling the relative amount of germanium in the embedded SiGe source/drain regions and the SiGe channel regions, the polarity of the compressive vertical stress may be controlled. With the various disclosed embodiments, PMOS transistors formed on a relaxed semiconductor substrate are provided with strain enhanced channel regions, regardless of the channel orientation of the relaxed PMOS active layer.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Referring now to FIG. 1, there is shown a partial cross-sectional view of a semiconductor wafer structure 1. The structure 1 includes a semiconductor layer 90 formed on or as part of a semiconductor substrate 106 that has a first crystallographic orientation. Also illustrated is a shallow trench isolation 94 that divides the layer 90 into separate regions. Depending on the type of transistor device being fabricated, the semiconductor layer 90, 106 may be formed from any semiconductor material, including, for example, Si, SiC, SiGe, SiGeC, Ge, GaAs, InAs, InP as well as other III/V or II/VI compound semiconductors or any combination thereof. Of note is that although bulk type of substrate is shown here for the description of the invention, the invention is not limited to any specific substrate type. For example, the starting substrate for the invention can be of semiconductor-on-insulator (SOI) type having a buried insulator layer under a top layer of semiconductor.

The isolation regions or structures 94 are formed to electrically isolate the NMOS device area(s) 96 from the PMOS device area(s) 97. Isolation structures 94 define lateral boundaries of an active region or transistor region 96, 97 in active layer 90, and may be formed using any desired technique, such as selectively etching an opening in the second semiconductor layer 90 using a patterned mask or photoresist layer (not shown), depositing a dielectric layer (e.g., oxide) to fill the opening, and then polishing the deposited dielectric layer until planarized with the remaining second semiconductor layer 90. Any remaining unetched portions of the patterned mask or photoresist layer(s) are stripped.

Figure 2:
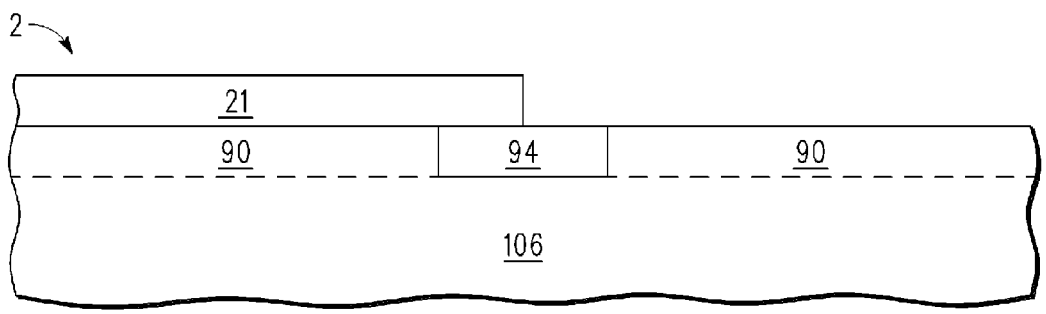
FIG. 2 illustrates processing subsequent to FIG. 1 where a masking layer is formed over NMOS areas of the semiconductor wafer structure that will be used to form NMOS devices.

FIG. 2 illustrates processing of a semiconductor wafer structure 2 subsequent to FIG. 1 where a masking layer 21 is selectively formed over NMOS areas 96 of the semiconductor wafer structure that will be used to form NMOS devices. For example, one or more masking layers 21 (e.g., an oxide layer and/or nitride layer) may be deposited and/or grown over the semiconductor wafer structure, and then conventional patterning and etching techniques may be used to form an opening in the mask layer(s) 21 that exposes at least the PMOS device area 97. The selectively formed masking layer 21 is used to define and differentiate active regions for NMOS and PMOS devices subsequently formed on the wafer structure 12.

Figure 3:
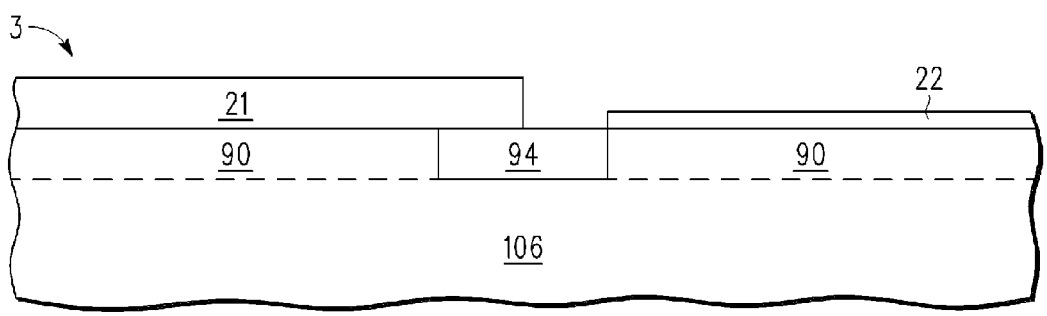
FIG. 3 illustrates processing subsequent to FIG. 2 after epitaxial SiGe is selectively formed over PMOS areas of the semiconductor wafer structure that will be used to form PMOS devices.

FIG. 3 illustrates processing of a semiconductor wafer structure 3 subsequent to FIG. 2 after an epitaxial semiconductor layer 22 is selectively formed over the PMOS area(s) 97 that will be used to form PMOS devices. By forming the epitaxial semiconductor layer 22 from a material having larger atom-to-atom spacing than the underlying second semiconductor layer 90, a biaxially-strained substrate channel region may be formed for the subsequently formed PMOS devices which has the same crystallographic orientation as the crystallographic orientation of the semiconductor layer 90, thereby optimizing the mobility of the holes and electrons for subsequently formed PMOS and NMOS devices formed on the semiconductor layer 90. Depending on the type of transistor device being fabricated, the semiconductor layer 22 may be formed from any semiconductor material, such as SiGe, SiC, SiGeC or combinations and composition by weight thereof, which is capable of being formed utilizing a selective epitaxial growth method or other deposition methods accompanied by subsequent re-crystallization. For example, if PMOS devices are formed over the semiconductor layer 90 in the PMOS area 97 and the semiconductor material for layer 90 is silicon, the semiconductor layer 22 may be formed by epitaxially growing SiGe having a crystallographic orientation (e.g., <100>) that is the same as the crystallographic orientation of the semiconductor layer 90. This epitaxial growth may be achieved by a process of chemical vapor deposition at a chamber temperature between 400 and 900° C. in the presence of dichlorosilane, germane (GeH4), HCl, and hydrogen gas. By forming a biaxially compressive SiGe channel layer 22 in the PMOS device area 97, significant mobility improvements are obtained over PMOS devices without the stress component.

Figure 4:
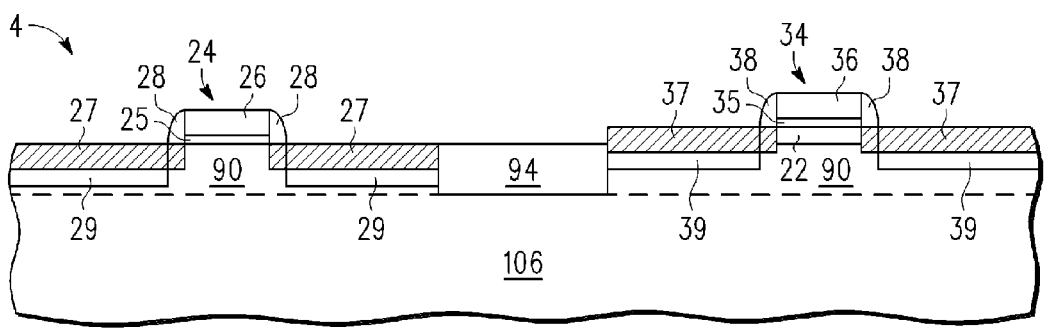
FIG. 4 illustrates processing subsequent to FIG. 3 after NMOS and PMOS FET devices are formed in the NMOS and PMOS areas.

FIG. 4 illustrates processing of a semiconductor wafer structure 4 subsequent to FIG. 3 after the mask layer 21 is removed, and NMOS transistor(s) 24 and PMOS transistor(s) 34 are formed in the NMOS and PMOS areas 96, 97, respectively. As illustrated, NMOS transistor 24 includes one or more gate dielectric layers 25, a conductive gate electrode 26 overlying the gate dielectric 25, sidewall spacers 28 formed from one or more dielectric layers on the sidewalls of gate electrode 26, and source/drain regions 27, 29 formed in the NMOS active layer 90. In similar fashion, PMOS transistor 34 includes one or more gate dielectric layers 35, a conductive gate electrode 36 overlying the gate dielectric 35, sidewall spacers 38 formed from one or more dielectric layers on the sidewalls of gate electrode 36, and source/drain regions 37, 39 formed in the PMOS active layer 22, 90. Gate dielectric layer(s) 25, 35 may be formed by depositing or growing an insulator or high-k dielectric (e.g., silicon dioxide, oxynitride, metal-oxide, nitride, etc.) over the NMOS substrate layer 90 and PMOS substrate layer 22 using chemical vapor deposition (CVD), plasma-enhanced chemical vapor deposition (PECVD), physical vapor deposition (PVD), atomic layer deposition (ALD), thermal oxidation, or any combination(s) of the above to a predetermined final thickness in the range of 0.1-10 nanometers, though other thicknesses may be used. Conductive gate electrodes 26, 36 may be a heavily doped (n+) polysilicon gate electrode, a metal gate electrode, or a combination thereof that is formed using any desired deposition or sputtering process, such as CVD, PECVD, PVD, ALD, molecular beam deposition (MBD) or any combination(s) thereof to a predetermined final thickness in the range of 1-100 nanometers, though other thicknesses may be used. Sidewall spacers 28, 38 may be formed from an offset or spacer liner layer (e.g., a deposited or grown silicon oxide), alone or in combination with an extension spacer formed by depositing and anisotropically etching a layer of dielectric. Subsequent to forming at least the gate electrodes 26, lightly doped extension regions 27 may be formed by selectively masking the PMOS areas 97 to expose NMOS implant regions (not shown) and implanting n-type impurities into the exposed substrate layer 90, using the gate electrode(s) 26, alone or with an offset/spacer liner layer, as a implant mask to protect the NMOS channel from implantation. In addition or in the alternative, heavily doped source/drain regions 29 may be formed by selectively masking the PMOS area 97 to expose NMOS implant regions (not shown) and implanting n-type impurities into the exposed substrate layer 90, using the gate electrode(s) 26, alone or with an offset or spacer liner layer and/or extension spacer, as a implant mask to protect the NMOS channel from implantation. In similar fashion, the extension regions 37 and/or source/drain region 39 in the PMOS area 97 may be formed by implanting p-type impurities into the exposed epitaxial semiconductor layer 22 and the substrate layer 90 in the PMOS area 97. Though not shown, it will be appreciated, that the NMOS and PMOS transistors may include silicide layers in the source/drain regions and gate electrodes.

Figure 5:
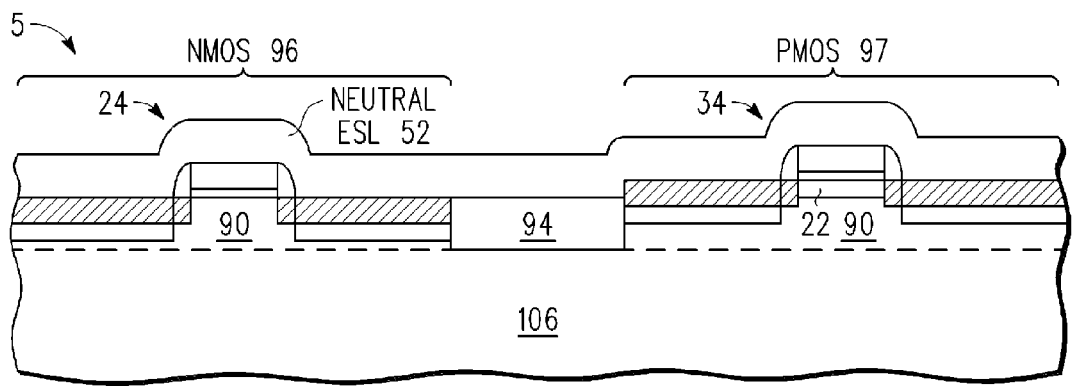
FIG. 5 illustrates processing subsequent to FIG. 4 after a neutral stress contact etch stop layer is formed over the NMOS and PMOS FET devices in accordance with one or more first example embodiments.

Referring now to FIG. 5, there is illustrated the processing of the semiconductor wafer structure 5 subsequent to FIG. 4 after a neutral stress contact etch stop layer (ESL) 52 is formed over the NMOS and PMOS transistors 24, 34 in accordance with one or more first example embodiments. In selected embodiments, the neutral contact etch stop layer 52 is formed as silicon nitride that is deposited using a plasma-enhanced CVD technique to a thickness in the range of 300-850 Angstroms, and more particularly approximately 600 Angstroms, though other materials and/or thicknesses may be used. For a silicon nitride layer, typically the Si—N to Si—H bonding influences whether there is stress and/or the stress type (tensile or compressive). In the embodiments depicted in FIG. 5, the deposition conditions (e.g., deposition rate, pressure, UV curing, and other factors known in the art) are controlled in such a way that there is no stress created within the ESL layer 52 and in between the layer 52 and the underlying NMOS and PMOS channel regions. Though not shown in the figures, it will be appreciated, that a thicker dielectric may be formed (e.g., deposited) over the stress contact etch stop layer to a predetermined thickness (e.g., approximately 3500 Angstroms).

At the point in the fabrication process shown in FIG. 5 after formation of a neutral stress contact etch stop layer 52, the PMOS transistor device 34 is formed over a semiconductor layer 90 and a biaxially compressive SiGe channel layer 22, and is covered with a neutral stress contact etch stop layer 52. As formed, the PMOS active region includes an epitaxial silicon germanium layer 22 (formed over the semiconductor layer 90 in the PMOS area 97) that exhibits biaxial compressive stress (e.g., inwardly) in both the length (a.k.a. channel) axis and width axis directions which, in accordance with selected embodiments, improves the carrier mobility (and thus the performance) of the PMOS transistor(s) 34.

Figure 6:
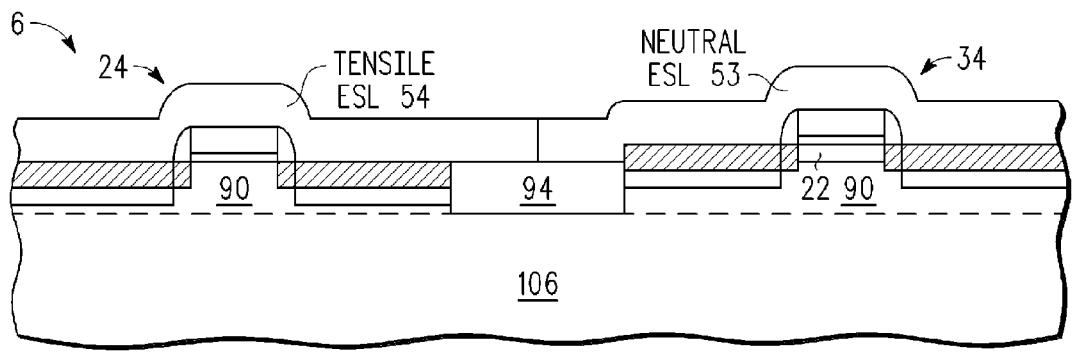
FIG. 6 illustrates processing subsequent to FIG. 4 after a neutral stress contact etch stop layer is formed over the PMOS FET devices and a tensile stress contact etch stop layer is formed over the NMOS FET devices in accordance with one or more second example embodiments.

In accordance with other embodiments, the carrier mobility for both NMOS and PMOS transistors may be further optimized selectively modifying the stress of the PMOS and NMOS transistors using differential stress contact etch stop layers. For example, FIG. 6 illustrates processing of the semiconductor wafer structure 6 subsequent to FIG. 4 after a neutral stress contact etch stop layer 53 is formed over the PMOS transistor devices 34 and a tensile stress contact etch stop layer 54 is formed over the NMOS transistor devices 24. When the contact etch stop layers 53, 54 are formed with deposited silicon nitride, the Si—N to Si—H bonding in each of the stress contact etch stop layers 53, 54 may be used to influence the type and direction of stress (e.g., tensile, compressive, neutral). Other factors (such as deposition rate, pressure, UV curing, etc.) also affect the stress. In addition, other techniques may be used to relax the tensile stress contact etch stop layer so that it becomes a neutral stress contact etch stop layer, such as implanting a tensile liner with Xenon. Thus, those skilled in the art will appreciate that any of a variety of desired techniques may be used to form the differentially stressed liner layers 53, 54. For example, a first neutral stress contact etch stop layer 53 may be deposited over the entire substrate, and a masked patterning etch process is applied to remove the neutral ESL from NMOS regions, leaving PMOS areas covered with neutral ESL. Subsequently, a second tensile stress layer 54 is deposited as a blanket film, followed by a masked patterning etch process to removed the tensile ESL from PMOS regions, leaving NMOS regions covered with tensile ESL. Alternatively, a single tensile stress contact etch stop layer of silicon nitride may be blanket deposited over the entire semiconductor wafer structure 6, and then a patterned photoresist layer (not shown) may be formed over the NMOS area 96 so that the portion of the tensile liner layer over the PMOS area 97 may be implanted (e.g., by implanting Xenon) to relax the exposed tensile stress contact etch stop layer to form a neutral stress contact etch stop layer over the PMOS area 97. At the point in the fabrication process shown in FIG. 6, the PMOS transistor device 34 is formed over a semiconductor layer 90, is covered with a neutral stress contact etch stop layer 53, and includes an epitaxial silicon germanium channel layer 22 that exhibits biaxial compressive stress, while the NMOS transistor 24 is covered with a tensile stress contact etch stop layer 54 which causes the NMOS active region to exhibit uniaxial tensile stress.

Figure 7:
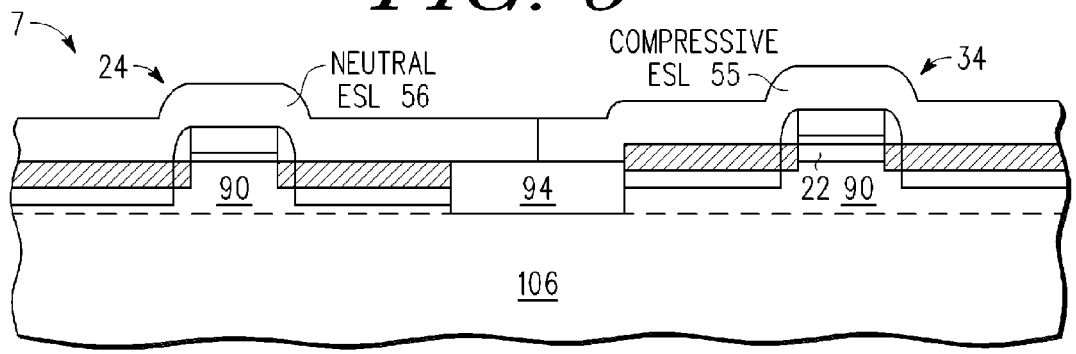
FIG. 7 illustrates processing subsequent to FIG. 4 after a compressive stress contact etch stop layer is formed over the PMOS FET devices and a neutral stress contact etch stop layer is formed over the NMOS FET devices in accordance with one or more third example embodiments.

Another example to show how differential stress contact etch stop layers may be used to optimize carrier mobility is depicted in FIG. 7 which illustrates processing of the semiconductor wafer structure 7 subsequent to FIG. 4 after a compressive stress contact etch stop layer 55 is formed over the PMOS transistor devices 34 and a neutral stress contact etch stop layer 56 is formed over the NMOS transistor devices 24. Along with other factors, the Si—N to Si—H bonding may be used to influence the type and direction of stress (e.g., tensile, compressive, neutral) of the stress contact etch stop layers 55, 56. Again, any of a variety of desired techniques may be used to form the differentially stressed liner layers 55, 56. For example, a compressive stress contact etch stop layer may be blanket deposited over the entire semiconductor wafer structure 7 and then selectively etched away from the NMOS area 96, followed by a blanket deposition of a neutral stress contact etch stop layer over the entire semiconductor wafer structure 7 (including the NMOS area 96) and an etch process to remove the neutral stress contact etch stop layer from the PMOS area 97. Alternatively, a single compressive stress contact etch stop layer of silicon nitride may be blanket deposited over the entire semiconductor wafer structure 7, and then a patterned photoresist layer (not shown) may be formed over the PMOS area 97 so that the portion of the liner layer over the NMOS area 96 may be implanted (e.g., by implanting Xenon) to relax the exposed compressive stress contact etch stop layer to form a neutral stress contact etch stop layer over the NMOS area 96. At the point in the fabrication process shown in FIG. 7 after formation of a compressive stress contact etch stop layer 55, the PMOS transistor device 34 is formed over a semiconductor layer 90, is covered with a compressive stress contact etch stop layer 55, and includes an epitaxial silicon germanium channel layer 22 that exhibits biaxial compressive stress, while the NMOS transistor 24 is covered with a neutral stress contact etch stop layer 56.

Figure 8:
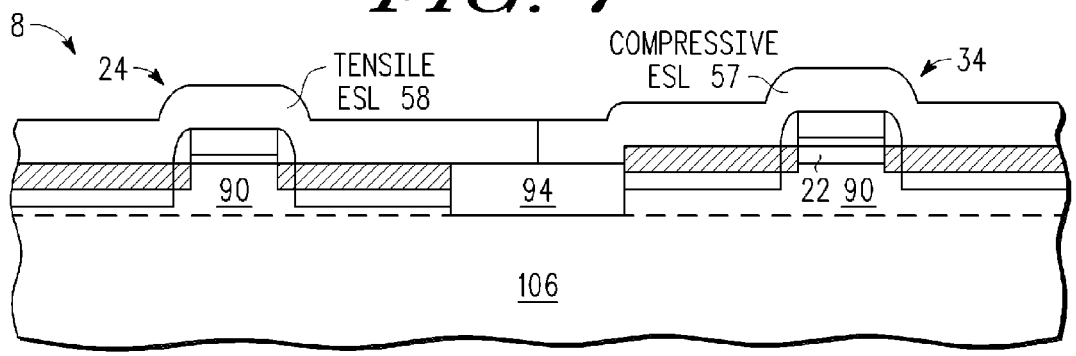
FIG. 8 illustrates processing subsequent to FIG. 3 after a compressive stress contact etch stop layer is formed over the PMOS FET devices and a tensile stress contact etch stop layer is formed over the NMOS FET devices in accordance with one or more fourth example embodiments.

Yet another example to show how differential stress contact etch stop layers may be used to optimize carrier mobility is depicted in FIG. 8 which illustrates processing of the semiconductor wafer structure 8 subsequent to FIG. 4 after a compressive stress contact etch stop layer 57 is formed over the PMOS transistor devices 34 and a tensile stress contact etch stop layer 58 is formed over the NMOS transistor devices 24. The stress type and direction of the differential stress contact etch stop layers 57, 58 may be controlled using any of a variety of desired techniques described herein. For example, a compressive stress contact etch stop layer may be blanket deposited over the entire semiconductor wafer structure 8 and then selectively etched away from the NMOS area 96, followed by a blanket deposition of a tensile stress contact etch stop layer over the entire semiconductor wafer structure 8 (including the NMOS area 96) and an etch process to remove the tensile stress contact etch stop layer from the PMOS area 97. At the point in the fabrication process shown in FIG. 8, the PMOS transistor device 34 is formed over a semiconductor layer 90, is covered with a compressive stress contact etch stop layer 55, and includes an epitaxial silicon germanium channel layer 22 that exhibits biaxial compressive stress, while the NMOS transistor 24 is covered with a tensile stress contact etch stop layer 56 which causes the NMOS active region to exhibit uniaxial tensile stress.

Figure 9:
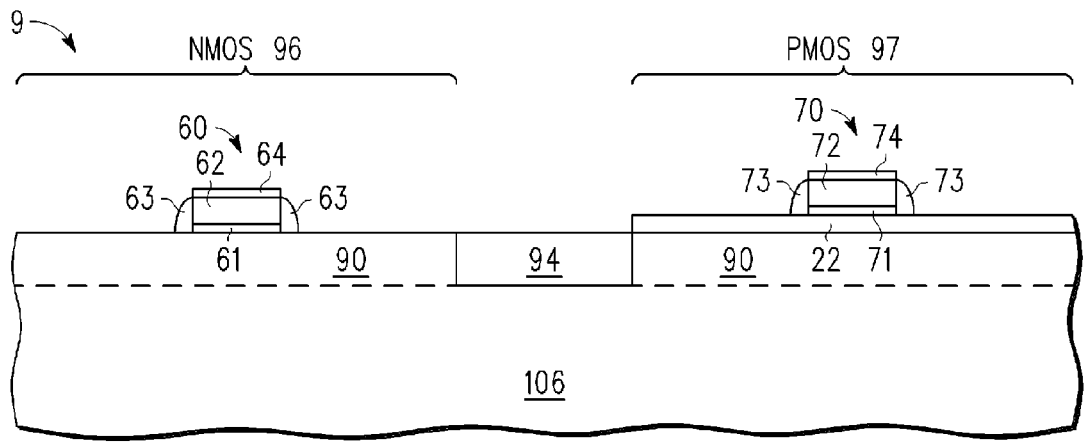
FIG. 9 illustrates processing subsequent to FIG. 3 after NMOS and PMOS gate electrode structures are formed in the NMOS and PMOS areas in accordance with one or more fifth example embodiments.

In addition to the various differential stressing schemes described hereinabove for forming a compressive SiGe channel layer in the PMOS transistor devices, there are other techniques for differentially stressing the NMOS and PMOS channel regions. For example, FIG. 9 illustrates processing of the semiconductor wafer structure 9 subsequent to FIG. 3 after the mask layer 21 is removed, and NMOS gate electrode structure(s) 60 and PMOS gate electrode structure(s) 70 are formed in the NMOS and PMOS areas 96, 97, respectively. As illustrated, NMOS gate electrode structure 60 may include one or more gate dielectric layers 61 formed over the NMOS active area 90 in the NMOS region 96, a conductive gate electrode 62 overlying the gate dielectric 61, sidewall spacers 63 formed from one or more dielectric layers on the sidewalls of gate electrode 62, and a dielectric cap layer 64 formed on the top of the gate electrode 62 (e.g., by depositing or thermally growing silicon dioxide to cover the gate electrode 62). In similar fashion, PMOS gate electrode structure 70 may include one or more gate dielectric layers 71 formed over the PMOS active layer 90 in the PMOS region 97, a conductive gate electrode 72 overlying the gate dielectric 71, sidewall spacers 73 formed from one or more dielectric layers on the sidewalls of gate electrode 72, and a dielectric cap layer 74 formed on the top of the gate electrode 72. As described herein, any desired fabrication techniques may be used to grow, deposit, pattern, remove, etch or otherwise forming the various transistor device features.

Figure 10:
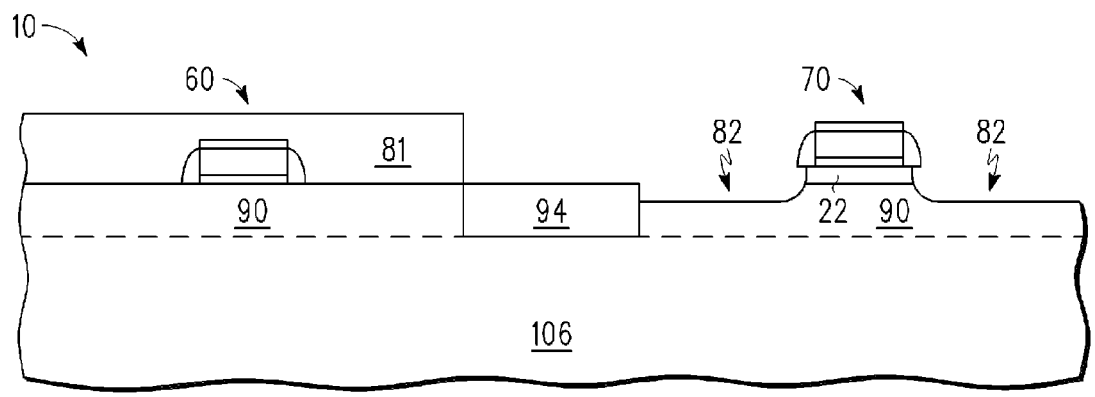
FIG. 10 illustrates processing subsequent to FIG. 9 after a mask layer is formed over the NMOS areas and recesses are formed in the source/drain regions of the PMOS FET devices.

Turning now to FIG. 10, there is illustrated processing of the semiconductor wafer structure 10 subsequent to FIG. 9 after a mask layer 81 is formed over the NMOS areas 96 and recesses 82 are formed in the source/drain regions of the PMOS transistors. While the masking layer 81 may be formed with any desired masking technique, in a selected embodiment, a thin oxide layer (not shown) is deposited or grown overlying the NMOS area 96, followed by a photoresist patterned selective removal of masking layer 81 overlaying the PMOS area 97.

After masking the NMOS area 96, one or more active etch processes are performed to create source/drain recesses 82 in PMOS active region by selectively etching the exposed epitaxial semiconductor layer 22 and underlying semiconductor layer 90 in the PMOS area 97. The selective etching of the PMOS active region may use one or more etching steps to selectively remove the unprotected portions of the epitaxial semiconductor layer 22 and semiconductor layer 90, including a dry etching process such as reactive-ion etching, ion beam etching, plasma etching or laser etching, a wet etching process wherein a chemical etchant is employed or any combination thereof. In selected embodiments, the active layer is etched using one or more reactive-ion etching processes that are controlled and applied to be highly selective between the active layer material (e.g., semiconductor layer 90 and epitaxial semiconductor layer 22), and the dielectric materials, such as the dielectric masking layer 81 (e.g., silicon nitride), the isolation structure(s) 94 (e.g., silicon oxide), the sidewall spacers 73 formed on the PMOS gate electrode 72 and the dielectric capping layer 74. As depicted in FIG. 10, the active layer etch process(es) may be relatively anisotropic such that the depth of recess 82 at least as deep (or preferably deeper) as the amount of horizontal or lateral etch under the sidewall spacers 73, which is represented by the amount by which recess 82 undercuts PMOS gate structure 70. As finally formed, the etch process(es) used to form the active layer recesses 82 terminate before etching through PMOS active region, thereby leaving a portion of semiconductor layer 90 in the PMOS area 97 covering buried oxide layer 80.

Figure 11:
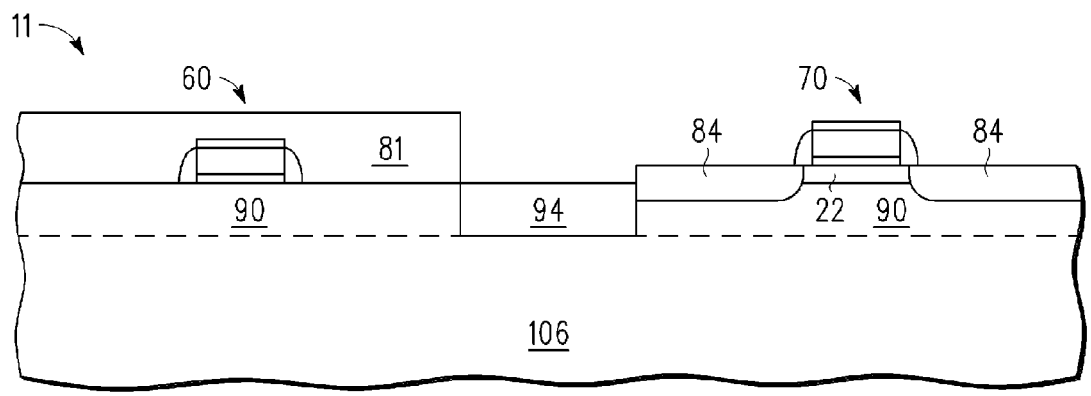
FIG. 11 illustrates processing subsequent to FIG. 10 after PMOS source/drain structures are formed to fill the source/drain recesses.

Turning now to FIG. 11, the processing of the semiconductor wafer structure 11 is illustrated subsequent to FIG. 10 after PMOS source/drain structures 84 are formed to fill the source/drain recesses 82. In selected embodiments, the source/drain structures 84 are formed using a selective epitaxial growth technique. Source/drain structures 84 may be of silicon or another semiconductor element or compound. In selected embodiments, source/drain structures 84 have a lattice constant that is greater than the lattice constant of the material in the semiconductor layer 90 forming the PMOS active region. For example, when silicon is used for the semiconductor layer 90 in the PMOS active region, the source/drain structures 84 may be formed from epitaxial silicon germanium, thereby inducing compressive channel strain due to lattice mismatch. In forming the epitaxial SiGe source/drain structures 84, the percentage of germanium may be monitored to control the polarity of the vertical stress. In particular, when the percentage of germanium in the embedded SiGe source/drain structures 84 is greater than the percentage of germanium in the epitaxial SiGe channel layer 22, a tensile vertical stress is created in the channel region. And when the percentage of germanium in the embedded SiGe source/drain structures 84 is less than the percentage of germanium in the epitaxial SiGe channel layer 22, a compressive vertical stress is created in the channel region. Thus, the formation of source/drain structures 84 can be controlled to create a compressive stress component along the channel axis in PMOS channel region. At the point in the fabrication process shown in FIG. 11, the PMOS transistor device 70 is formed over a semiconductor layer 90, includes embedded SiGe source/drain stressor structures 84, and includes an epitaxial silicon germanium channel layer 22 that exhibits biaxial compressive stress, while the NMOS transistor 60 includes an NMOS active region does not have those compressive stress components.

The PMOS source/drain structures 84 may be doped to the appropriate p-type conductivity level by performing in-situ doping during epitaxial growth of the embedded SiGe source/drain structures 84. For example, the source/drain recesses 82 may be filled with boron-doped silicon germanium (SiGe:B) by using selective epitaxial growth of in situ heavily B-doped $Si_{1-x}Ge_x$. In addition or in the alternative, p-type impurities (e.g., boron) may be implanted following formation of epitaxial source/drain structures 84 by forming a patterned masking or photoresist layer (not shown) which exposes the intended PMOS source/drain regions, and then performing one or more PMOS source/drain implants. As will be appreciated, the NMOS source/drain implant may be performed before or after the formation of epitaxial source/drain structures 84, either before or after doping or implanting the epitaxial PMOS source/drain regions 84. In addition, additional stressed contact etch stop layers may be formed over the NMOS and PMOS transistor(s) 60, 70 to further stress the channel regions.

Figure 12:
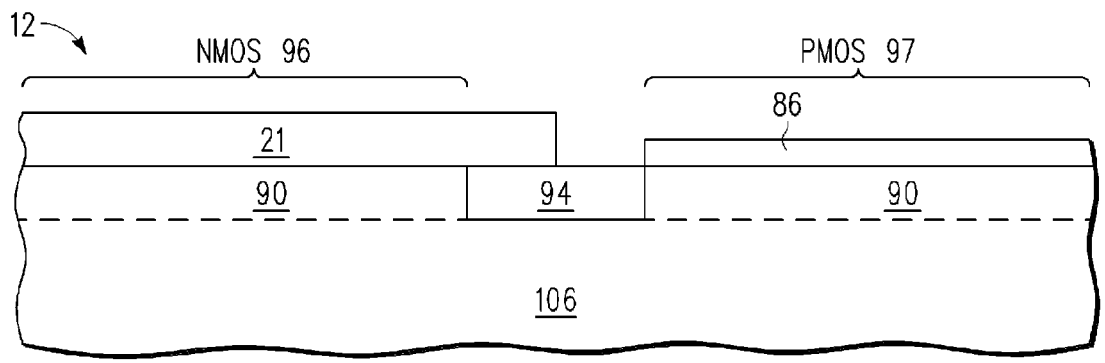
FIG. 12 illustrates processing subsequent to FIG. 2 after a layer of SiC is formed over PMOS areas of the semiconductor wafer structure that will be used to form PMOS devices in accordance with one or more sixth example embodiments.

In accordance with other embodiments, the NMOS and PMOS channel regions may be differentially stressed by including an additional embedded layer of tensile semiconductor material below the compressed PMOS channel SiGe regions. For example, FIG. 12 illustrates processing of the semiconductor wafer structure 12 subsequent to FIG. 2 after an embedded layer of semiconductor material with reduced lattice constant, such as a silicon carbide (SiC) layer 86, is selectively formed over the exposed semiconductor layer 90 in the PMOS areas 97 of the semiconductor wafer structure 12. The embedded layer of tensile semiconductor material 86 may be formed by bonding a SiC layer or by epitaxially growing SiC having a channel crystallographic orientation (e.g., <100>) that is the same as the crystallographic orientation of the semiconductor layer 90. This epitaxial growth may be achieved by a process of chemical vapor deposition at a chamber temperature between 400 and 900° C. in the presence of dichlorosilane, methylsilane, HCl and hydrogen gas. The SiC layer 86 is preferably relaxed, which may be reached by growing the film to exceed the critical thickness in maintaining its film stress.

Figure 13:
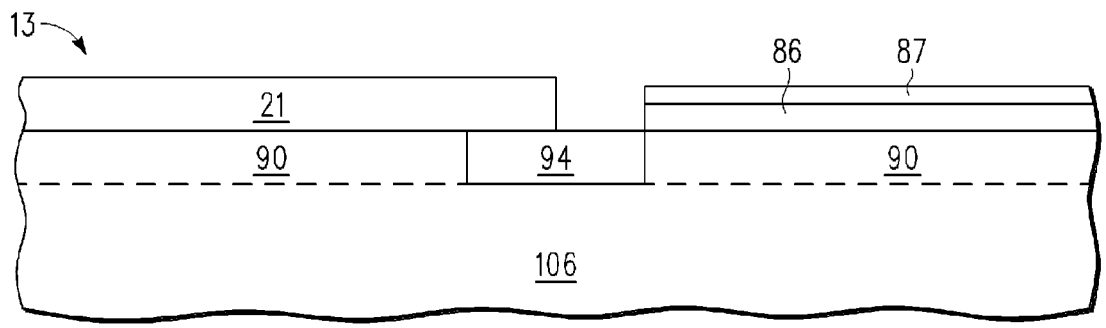
FIG. 13 illustrates processing subsequent to FIG. 12 after epitaxial SiGe is selectively formed over the SiC layer in the PMOS areas of the semiconductor wafer structure.

After forming the embedded layer 86 (e.g., SiC) over the semiconductor layer 90 in the PMOS area 97, an additional channel layer of compressed semiconductor material 87 (e.g., epitaxial SiGe) may be selectively formed over the epitaxial SiC layer 86 in the PMOS areas 97 of the semiconductor wafer structure 13, as illustrated in FIG. 13. By forming the epitaxial SiGe layer 87 from a material having much larger atom-to-atom spacing than the underlying SiC layer 86, a biaxially-strained compressive substrate channel region may be formed for the subsequently formed PMOS devices which have the same crystallographic orientation as the crystallographic orientation of the semiconductor layer 90, thereby maximizing the strain on the PMOS channel region. Again, the epitaxial growth may be achieved by a process of chemical vapor deposition at a chamber temperature between 400 and 900° C. in the presence of dichlorosilane, germane, HCl and hydrogen gas.

Figure 14:
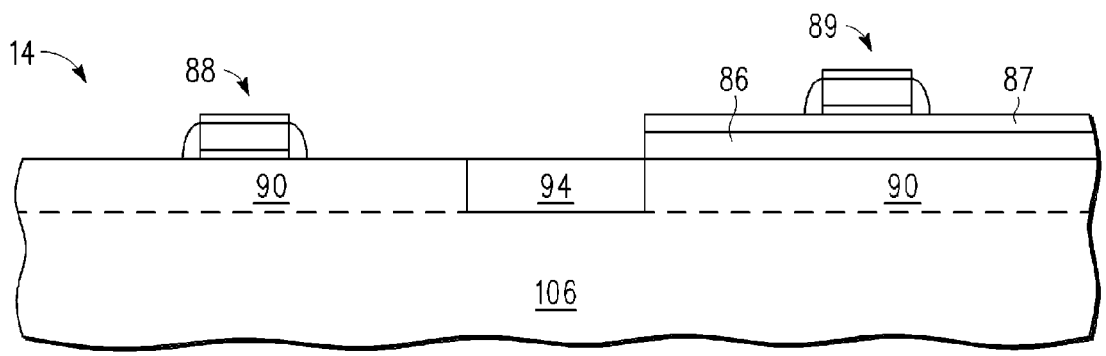
FIG. 14 illustrates processing subsequent to FIG. 13 after NMOS and PMOS gate electrode structures are formed in the NMOS and PMOS areas.

Turning now to FIG. 14, there is illustrated processing of the semiconductor wafer structure 14 subsequent to FIG. 13 after the mask layer 21 is removed, and NMOS gate electrode structure(s) 88 and PMOS gate electrode structure(s) 89 are formed in the NMOS and PMOS areas 96, 97, respectively. As will be appreciated, the depicted NMOS and PMOS gate electrode structure(s) 88, 89 are similar to the gate electrode structures 60, 70 described with reference to FIG. 9, and may be formed using any desired fabrication techniques. As formed, the NMOS gate electrode structure 88 is formed on the semiconductor layer 90 in the NMOS area 96, and may include one or more gate dielectric layers, a conductive gate electrode overlying the gate dielectric, sidewall spacers formed from one or more dielectric layers on the sidewalls of gate electrode, and a dielectric cap layer formed on the top of the gate electrode (e.g., by depositing or thermally growing silicon dioxide to cover the gate electrode). In similar fashion, PMOS gate electrode structure 89 is formed on the epitaxial SiGe layer 87 in the PMOS area 97, and may include one or more gate dielectric layers, a conductive gate electrode overlying the gate dielectric, sidewall spacers formed from one or more dielectric layers on the sidewalls of gate electrode, and a dielectric cap layer formed on the top of the gate electrode.

Figure 15:
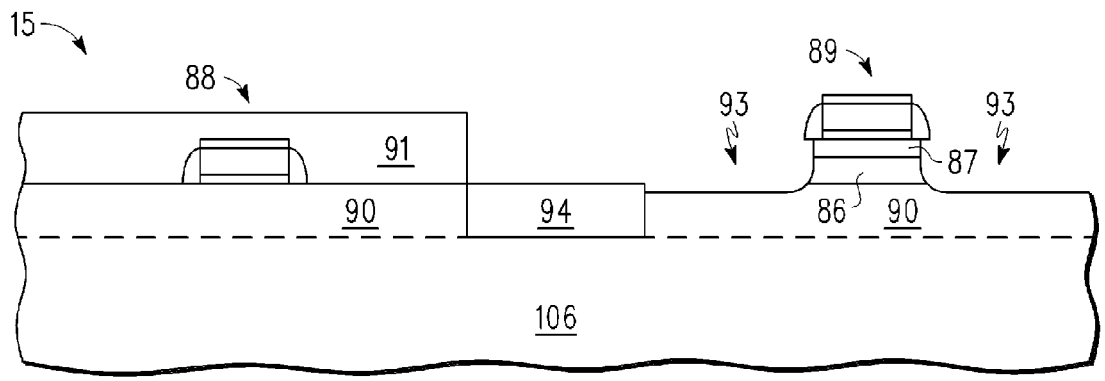
FIG. 15 illustrates processing subsequent to FIG. 14 after a mask layer is formed over the NMOS areas and recesses are formed in the source/drain regions of the PMOS FET devices.

Turning now to FIG. 15, there is illustrated processing of the semiconductor wafer structure 15 subsequent to FIG. 14 after a patterned mask layer 91 is formed over the NMOS areas 96, and recesses 93 are formed in the source/drain regions of the PMOS transistors. As will be appreciated, the patterned masking layer 91 may be formed by depositing and selectively etching one or more masking layers (e.g., a pad oxide and nitride layer) to protect the NMOS gate electrode structure(s) 88 in the NMOS area 96. After masking the NMOS area 96, one or more active etch processes are performed to create source/drain recesses 93 in PMOS active region by selectively etching the exposed epitaxial SiGe layer 87, SiC layer 86 and underlying semiconductor layer 90 in the PMOS area 97. In selected embodiments, the active layer is etched using one or more reactive-ion etching processes that are controlled and applied to be highly selective between the active layer materials (e.g., semiconductor layer 90, epitaxial SiC layer 86 and epitaxial SiGe layer 87), and the dielectric materials, such as the dielectric masking layer 91 (e.g., silicon nitride), the isolation structure(s) 94 (e.g., silicon oxide), and the sidewall spacers and the dielectric capping layers formed on the PMOS gate electrode structure(s) 89. As depicted in FIG. 15, the active layer etch process(es) may be relatively anisotropic so that the depth of source/drain recesses 93 exceeds the amount of lateral undercutting below the PMOS gate electrode structure(s) 89.

Figure 16:
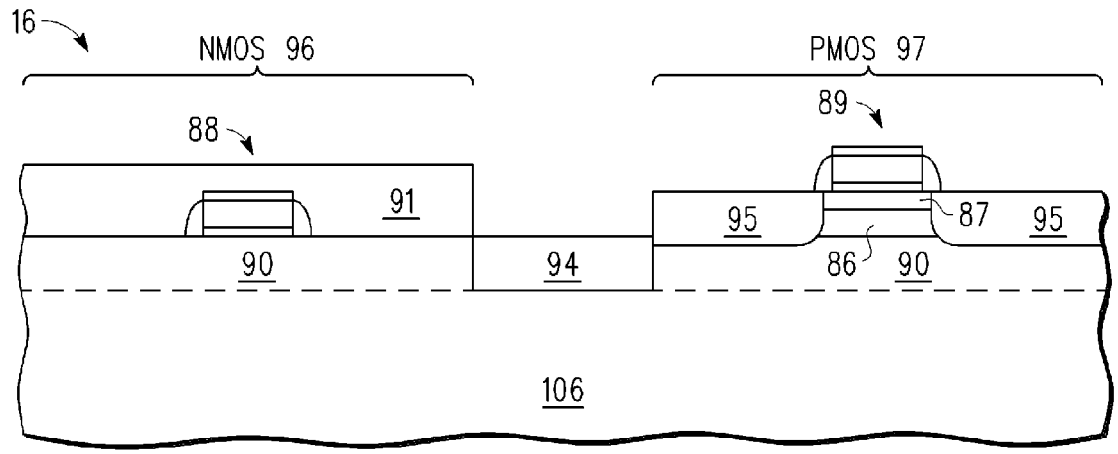
FIG. 16 illustrates processing subsequent to FIG. 15 after PMOS source/drain structures are formed to fill the source/drain recesses.

Turning now to FIG. 16, the processing of the semiconductor wafer structure 16 is illustrated subsequent to FIG. 15 after PMOS source/drain structures 95 are formed to fill the source/drain recesses 93. In selected embodiments, the source/drain structures 95 are formed using a selective epitaxial growth technique. Source/drain structures 95 may be of silicon or another semiconductor element or compound. In selected embodiments, source/drain structures 95 have a lattice constant that is greater than the lattice constant of the material in the semiconductor layer 90, thereby resulting in the creation of a compressive stress component along the channel axis in PMOS channel region. The PMOS source/drain structures 95 may be doped to the appropriate p-type conductivity level by performing in-situ doping or implanting the embedded SiGe source/drain structures 95 with p-type impurities (e.g., boron). In addition, the NMOS source/drain regions may be implanted before or after the formation of epitaxial source/drain structures 95.

At the point in the fabrication process shown in FIG. 16, the PMOS transistor device 89 is formed over a semiconductor layer 90, includes embedded SiGe source/drain stressor structures 95, and includes an epitaxial SiC layer 86 and SiGe layer 87 that exhibit biaxial compressive stress. The large lattice mismatch between the SiC layer 86 and SiGe layer 87 maximizes the strain enhancement in the channel region of the PMOS transistor 89. Additional differential stress contact etch stop layers may be formed over the NMOS and PMOS transistor(s) 88, 89 to further stress the channel regions by using similar approaches as described for FIGS. 5-8.

In addition to the various differential stressing schemes described hereinabove for forming PMOS transistor devices with a compressive SiGe channel layer that is formed over a silicon substrate, there are other techniques for differentially stressing the NMOS and PMOS channel regions. For example, FIGS. 17-20 illustrate a semiconductor fabrication process and resulting integrated circuit are described for manufacturing high performance CMOS transistor devices on a semiconductor wafer substrate having a common channel orientation for both PMOS and NMOS devices by selectively controlling the channel stress conditions of the PMOS devices in a semiconductor wafer to produce an integrated circuit having stress conditions that are favorable for both NMOS and PMOS devices. As a preliminary step, a strained semiconductor layer having any desired channel orientation is formed that exhibits biaxial tensile stress. As formed, the biaxial tensile stress of the strained semiconductor layer may advantageously be used to form NMOS transistors having improved carrier mobility. However, the strained semiconductor layer is then selectively relaxed in the PMOS device region to define a PMOS active layer having a lattice constant that is smaller than the lattice constant of a subsequently-grown epitaxial silicon germanium channel layer in the PMOS device region. The resulting epitaxial silicon germanium channel layer exhibits biaxial compressive stress which may advantageously be used to form PMOS transistors having improved carrier mobility, even if no additional etch stop layers are formed to differentially stress the PMOS and NMOS transistor channel regions.

Figure 17:
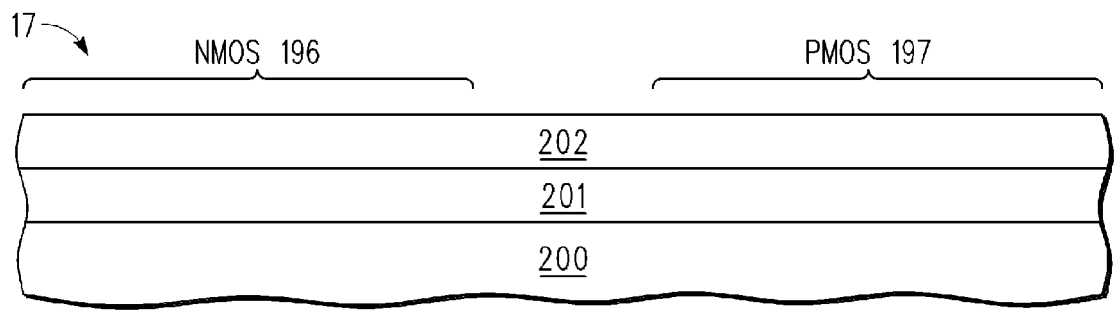
FIG. 17 is a partial cross-sectional view of a semiconductor wafer structure on which a strained semiconductor layer having a first crystalline structure is formed over a dielectric layer in accordance with selected alternative embodiments.

Referring now to FIG. 17, there is shown a partial cross-sectional view of a semiconductor wafer structure 17 on which a biaxial-tensile strained semiconductor layer 202 having a first crystalline structure is formed over a dielectric layer 201 and substrate layer 200. The wafer substrate 17 is commonly known as strained semiconductor on insulator (SSOI). As will be appreciated, any of a variety of fabrication sequences can be used to form the semiconductor wafer structure 17. Though not explicitly shown, those skilled in the art will appreciate that the semiconductor wafer structure 17 may be formed by bonding a donor wafer to a handle wafer. With this technique, a handle wafer is processed to include the substrate layer 201 as the bulk portion of a stack including at least part of the dielectric layer 202 formed on the substrate layer 200. In addition, a donor wafer is processed to form a stack including at least part of the dielectric layer 201 and the strained semiconductor layer 202. By bonding the dielectric layer 201 portion of a donor wafer to the dielectric layer portion of the handling wafer, the semiconductor wafer structure 17 is formed.

Depending on the type of transistor device being fabricated, the first semiconductor layer 200 may be implemented as a bulk silicon substrate, single crystalline silicon (doped or undoped), SOI substrate, or any semiconductor material including, for example, Si, SiC, SiGe, SiGeC, Ge, GaAs, InAs, InP, as well as other III/V or II/VI compound semiconductors or any combination thereof, and may optionally be formed as the bulk handling wafer. The crystallographic orientation of the first semiconductor layer 200 may be (110), (111), or (100).

The structure 17 includes an insulator layer 201 formed on the first semiconductor layer 200 which will ultimately be used to form the buried oxide (BOX) layer for silicon-on-insulator devices. Silicon wafer bonding to obtain insulating layers between wafers to achieve semiconductor-on-insulator structure is known and described, for example, by Da Zhang et al in U.S. Patent Publication No. 2007/0238250.

The structure 17 also includes a second semiconductor layer 202 formed of a semiconductor material which has a second crystallographic orientation which may be the same as or different from the first crystallographic orientation. Depending on the type of transistor device being fabricated, the second semiconductor layer 202 may be formed from any semiconductor material, including, for example, Si, SiC, SiGe, SiGeC, Ge, GaAs, InAs, InP as well as other III/V or II/VI compound semiconductors or any combination thereof. The crystallographic orientation of the semiconductor layer 202 may be (110), (111), or (100). The semiconductor layer 202 has an intrinsic biaxial-tensile strain.

Figure 18:
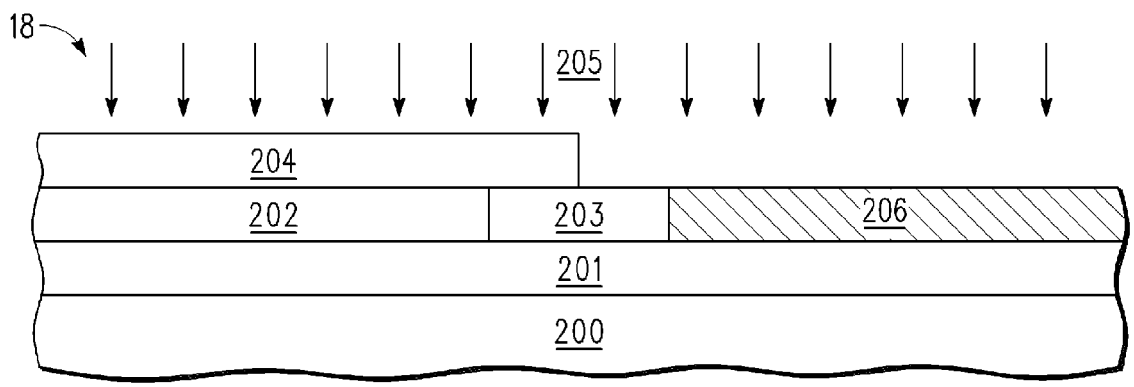
FIG. 18 illustrates processing subsequent to FIG. 17 after forming an isolation region to separate NMOS and PMOS areas where a masking layer is formed over NMOS areas and an implant is performed to relax the crystalline structure in the PMOS areas.

FIG. 18 illustrates processing of a semiconductor wafer structure 18 subsequent to FIG. 17 after forming one or more isolation regions 203 to divide the layer 202 into separate regions so as to electrically isolate the NMOS device area(s)

196 from the PMOS device area(s) 197. Isolation structures 203 define lateral boundaries of an active region or transistor region 196, 197 in active layer 202, and may be formed using any desired technique, such as selectively etching an opening in the second semiconductor layer 202 using a patterned mask or photoresist layer (not shown), depositing a dielectric layer (e.g., oxide) to fill the opening, and then polishing the deposited dielectric layer until planarized with the remaining second semiconductor layer 202. Any remaining unetched portions of the patterned mask or photoresist layer(s) are stripped.

After forming the isolation region(s) 203, FIG. 18 shows that a photoresist patterning process is done to form a photoresist-masking layer 204 over NMOS areas 196 of the semiconductor wafer structure that will be used to form NMOS devices. For example, one or more photoresist masking layers 204 (e.g., an oxide layer and/or nitride layer) may be deposited and/or grown over the semiconductor wafer structure, and then conventional patterning and etching techniques may be used to form an opening in the mask layer(s) 204 that exposes at least the PMOS device area 197. The selectively formed masking layer 204 is used to define and differentiate active regions for NMOS and PMOS devices subsequently formed on the wafer structure 18.

After masking off the strained semiconductor layer 202 in the NMOS region 196 with the masking layer 204, the crystalline structure in the PMOS areas 197 is processed to relax the strain. While any desired relaxation technique may be used, in selected embodiments, an implant 205 may be performed to relax the crystalline structure of the semiconductor layer 202 in the PMOS region 197. For example, by implanting the exposed semiconductor layer with silicon, germanium, carbon, or xenon, a relaxed semiconductor layer 206 is formed in the PMOS region 197. By appropriately implanting a neutral species, the relaxed semiconductor layer 206 may be obtained that has a lattice constant that is equivalent to unstrained silicon. After the relaxation step, the strained semiconductor layer 202 in the NMOS region 96 retains its biaxial tensile stress, which benefits carrier mobility in the subsequently formed NMOS transistor devices. In addition, the relaxed semiconductor layer 206 in the PMOS region 197 is used to form biaxial compressive channel regions for the subsequently formed PMOS transistor devices, as described hereinbelow. The photoresist layer 204 is stripped after the relaxation implantation.

Figure 19:
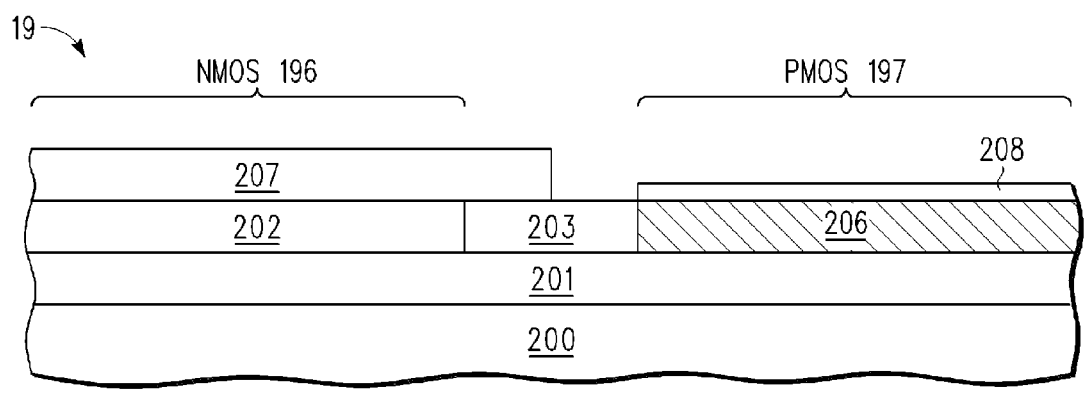
FIG. 19 illustrates processing subsequent to FIG. 18 after epitaxial SiGe is selectively formed over PMOS areas of the semiconductor wafer structure that will be used to form PMOS devices.

FIG. 19 illustrates processing of a semiconductor wafer structure 18 subsequent to FIG. 18 after an epitaxial semiconductor layer 208 is selectively formed over the relaxed semiconductor layer 206 in PMOS area(s) 197 that will be used to form PMOS devices. A masking structure 207 over NMOS areas 196 of the semiconductor wafer structure that will be used to form NMOS devices is first formed. For example, one or more masking layers 207 (e.g., an oxide layer and/or nitride layer) may be deposited and/or grown over the semiconductor wafer structure, and then conventional patterning and etching techniques may be used to form an opening in the mask layer(s) 207 that exposes at least the PMOS device area 197. The selectively formed masking layer 207 is used to define and differentiate active regions for NMOS and PMOS devices subsequently formed on the wafer structure 18. Selective epitaxial growth of layer 208 in the PMOS active area is done after the hardmask 207 is patterned. By forming the epitaxial semiconductor layer 208 from a material having larger atom-to-atom spacing than the underlying relaxed second semiconductor layer 206, a biaxially-strained compressive substrate channel region which has the same crystallographic orientation as the crystallographic orientation of the semiconductor layer 206 may be formed for the subsequently formed PMOS devices. Depending on the type of transistor device being fabricated, the epi semiconductor layer 208 may be formed from any semiconductor material, such as SiGe, SiC, SiGeC or combinations thereof, which is capable of being formed utilizing a selective epitaxial growth method. In selected embodiments, the epi semiconductor layer 208 is formed by epitaxially growing silicon germanium over the PMOS substrate layer 206 to a predetermined final thickness in the range of 50-150 Angstroms, though other thicknesses may be used. For example, if PMOS devices are formed over the relaxed semiconductor layer 206 in the PMOS area 197 and the semiconductor material for relaxed layer 206 is silicon, the semiconductor layer 208 formed by epitaxially growing SiGe has a lattice constant that is greater than the lattice constant of the relaxed semiconductor layer 206, and also has a crystallographic orientation that is the same as the crystallographic orientation of the relaxed semiconductor layer 206. This epitaxial growth may be achieved by a process of chemical vapor deposition at a chamber temperature between 400 and 900° C. in the presence of dichlorosilane, germane (GeH4), HCl, and hydrogen gas. By forming a biaxially compressive SiGe channel layer 208 in the PMOS device area 197, significant mobility improvements are obtained over PMOS devices without the stress component.

Figure 20:
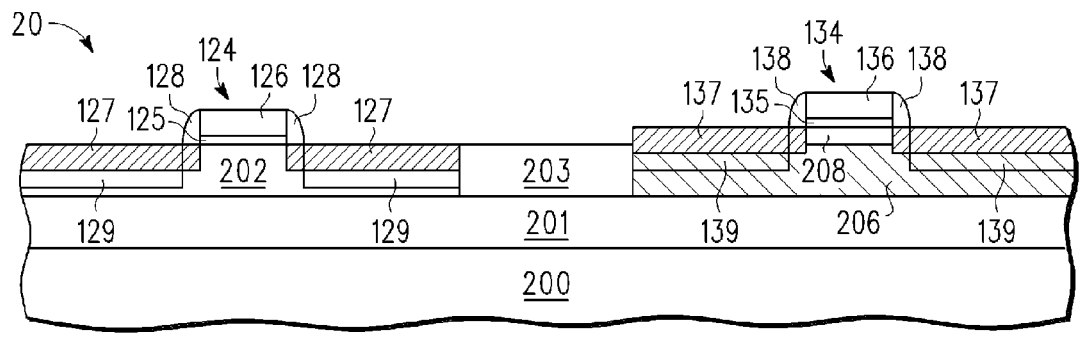
FIG. 20 illustrates processing subsequent to FIG. 19 after NMOS and PMOS FET devices are formed in the NMOS and PMOS areas.

FIG. 20 illustrates processing of a semiconductor wafer structure 20 subsequent to FIG. 19 after the mask layer 207 is removed, and NMOS transistor(s) 124 and PMOS transistor(s) 134 are formed in the NMOS and PMOS areas 196, 197, respectively. As illustrated, NMOS transistor 124 includes one or more gate dielectric layers 125, a conductive gate electrode 126 overlying the gate dielectric 125, sidewall spacers 128 formed from one or more dielectric layers on the sidewalls of gate electrode 126, and source/drain regions 127, 129 formed in the NMOS active layer 202. In similar fashion, PMOS transistor 134 includes one or more gate dielectric layers 135, a conductive gate electrode 136 overlying the gate dielectric 135, sidewall spacers 138 formed from one or more dielectric layers on the sidewalls of gate electrode 136, and source/drain regions 137, 139 formed in the PMOS active layer 206, 208. Gate dielectric layer(s) 125, 135 may be formed by depositing or growing an insulator or high-k dielectric (e.g., silicon dioxide, oxynitride, metal-oxide, nitride, etc.) over the NMOS substrate layer 202 and PMOS substrate layer 208 using CVD, PECVD, PVD, ALD, thermal oxidation, or any combination(s) of the above to a predetermined final thickness in the range of 0.1-10 nanometers, though other thicknesses may be used. Conductive gate electrodes 126, 136 may be a heavily doped (n+) polysilicon gate electrode, a metal gate electrode, or a combination thereof that is formed using any desired deposition or sputtering process, such as CVD, PECVD, PVD, ALD, molecular beam deposition (MBD) or any combination(s) thereof to a predetermined final thickness in the range of 1-100 nanometers, though other thicknesses may be used. Sidewall spacers 128, 138 may be formed from an offset or spacer liner layer (e.g., a deposited or grown silicon oxide), alone or in combination with an extension spacer formed by depositing and anisotropically etching a layer of dielectric. Subsequent to forming at least the gate electrodes 126, lightly doped extension regions 127 may be formed by selectively masking the PMOS areas 197 to expose NMOS implant regions (not shown) and implanting n-type impurities into the exposed substrate layer 202, using the gate electrode(s) 126, alone or with an offset/spacer liner layer, as a implant mask to protect the NMOS channel from implantation. In addition or in the alternative, heavily doped source/drain regions 129 may be formed by selectively masking the PMOS area 197 to expose NMOS implant regions (not shown) and implanting n-type impurities into the exposed substrate layer 202, using the gate electrode (s) 126, alone or with an offset or spacer liner layer and/or extension spacer, as a implant mask to protect the NMOS channel from implantation. In similar fashion, the extension regions 137 and/or source/drain regions 139 in the PMOS area 197 may be formed by implanting p-type impurities into the exposed epitaxial semiconductor layer 208 and the substrate layer 206 in the PMOS area 197. Though not shown, it will be appreciated, that the NMOS and PMOS transistors may include silicide layers in the source/drain regions and gate electrodes.

As described herein, the selective relaxation of the PMOS active layer may be used with a strained semiconductor layer exhibiting biaxial tensile stress, regardless of the channel orientation of the initial strained semiconductor layer, and still obtain an epitaxial silicon germanium channel layer exhibiting biaxial compressive stress which may advantageously be used to form PMOS transistors having improved carrier mobility. As a result, there is no requirement that additional etch stop layers be formed to differentially stress the PMOS and NMOS transistor channel regions. However, it will be appreciated that the differential stressing schemes described hereinabove with reference to the examples of FIGS. 5-16 may be used to form a compressive SiGe channel for the PMOS devices that is differentially stressed with respect to the NMOS device channel regions.

In selected embodiments, a biaxially strained semiconductor layer (e.g., a silicon layer exhibiting biaxial tensile stress) having any desired channel orientation is formed as an active layer over a buried oxide layer and separated into NMOS and PMOS active layers by an isolation structure. After masking off the NMOS active layer, the PMOS active layer is implanted with silicon or xenon to relax the strained semiconductor layer in the PMOS region. On the relaxed PMOS active layer, PMOS transistor devices with improved mobility are formed by epitaxially growing a layer of biaxially compressive silicon germanium (SiGe). Simultaneously, NMOS transistor devices are formed over the strained semiconductor layer in the NMOS area. In selected embodiments, a neutral stress contact etch stop layer is formed over the NMOS and PMOS transistor devices. Being fabricated on a biaxial-tensile strained substrate, the NMOS devices with a neutral stress contact etch stop layer have improved carrier mobility. With biaxially compressive channel SiGe and a neutral stress contact etch stop layer, a substantial enhancement in drive current (e.g., 66% improvement) is achieved as compared to PMOS devices formed without channel stressing. In other embodiments, PMOS device mobility may be further enhanced in a PFET transistor devices by growing an epitaxial layer of biaxially compressive silicon germanium (SiGe) on a silicon substrate, and then forming a compressive stress contact etch stop layer over the PMOS transistor devices. In still further embodiments, PMOS device mobility may be further enhanced in a PFET transistor devices by growing an epitaxial layer of biaxially compressive silicon germanium (alone or in combination with epitaxially grown silicon carbide) on a silicon substrate, and then forming embedded SiGe source/drain regions by epitaxially growing SiGe in source/drain recesses. By controlling the relative amount of germanium in the embedded SiGe source/drain regions and the SiGe channel regions, the polarity of the vertical stress (either compressive or tensile) may be controlled. With the various disclosed embodiments, PMOS transistors formed on a semiconductor substrate are provided with strain enhanced channel regions.

After completion of source/drain implant processing and dopant activation annealing, the semiconductor wafer structure is completed into a functioning device. Examples of different processing steps which may be used to complete the fabrication of the depicted gate electrode structures into functioning transistors include, but are not limited to, one or more sacrificial oxide formation, stripping, extension implant, halo implant, spacer formation, source/drain implant, source/drain anneal, contact area silicidation, and polishing steps. In addition, conventional backend processing (not depicted) typically including multiple levels of interconnect is then required to connect the transistors in a desired manner to achieve the desired functionality. Thus, the specific sequence of steps used to complete the fabrication of the gate transistors 88, 89 may vary, depending on the process and/or design requirements.

By now, it should be appreciated that there has been provided herein a semiconductor fabrication process for forming a PMOS field effect transistor device with enhanced carrier mobility. As disclosed, a wafer substrate with a first biaxial-tensile strained semiconductor layer is provided which has a first channel crystal orientation (e.g., <110>, <111>, or <100> silicon) exhibiting biaxial tensile stress. A portion of the first biaxial-tensile strained semiconductor layer is selectively relaxed where one or more PMOS transistor devices will be formed, thereby defining a PMOS active layer. The process of relaxing the PMOS active layer portion of the biaxial-tensile strained semiconductor layer may be implemented by selectively implanting (e.g., with silicon or xenon) the first biaxial-tensile strained semiconductor layer where one or more PMOS transistor devices will be formed to relax the crystal structure of the PMOS active layer. On the PMOS active layer, a second semiconductor layer (e.g., SiGe, alone or in combination with an underlying SiC layer) is epitaxially grown that has the same crystal orientation as the first crystal orientation and that has a larger atom-to-atom spacing than the underlying PMOS active layer. Subsequently, at least a PMOS gate structure is formed overlying the second semiconductor layer to define a PMOS transistor channel region in a portion of the second semiconductor layer below the PMOS gate structure such that the PMOS transistor channel region is subject to biaxial compressive stress. In addition, source/drain recesses may be etched through at least the second semiconductor layer and adjacent to the PMOS gate structure, and then filled by epitaxially growing silicon germanium to form embedded source/drain regions that compress the PMOS transistor channel region. Finally, a contact etch stop layer with preferable stress characteristics (e.g., a compressive or neutral liner layer) is deposited over the PMOS gate structure.

In another form, there is provided CMOS fabrication process for forming a semiconductor integrated circuit. In the disclosed process, a biaxial-tensile strained semiconductor layer having a <110>, <111>, or <100> channel orientation is formed. A first portion of the biaxial-tensile strained semiconductor layer is selectively masked where one or more NMOS transistor devices will be formed, thereby defining an NMOS active layer. With the mask in place, a second portion of the biaxial-tensile strained semiconductor layer is selectively relaxed where one or more PMOS transistor devices will be formed, thereby defining a PMOS active layer. The process of relaxing the PMOS active layer portion of the biaxial-tensile strained semiconductor layer may be implemented by selectively implanting (e.g., with silicon or xenon) the biaxial-tensile strained semiconductor layer where one or more PMOS transistor devices will be formed to relax the crystal structure of the PMOS active layer. After epitaxially growing a biaxially compressive semiconductor channel layer (e.g., a SiGe, alone or in combination with an underlying SiC layer) on the PMOS active layer, NMOS and PMOS gate structures are formed. As formed, the PMOS gate structure overlies the biaxially compressive semiconductor layer to define a PMOS transistor channel region in a portion of the biaxially compressive semiconductor layer below the PMOS gate structure. In addition, the NMOS gate structure is formed to overly the NMOS active layer to define a NMOS transistor channel region in a portion of the NMOS active layer below the NMOS gate structure. Thereafter, one or more contact etch stop layers are formed over the NMOS and PMOS gate structures. In some embodiments, the contact etch stop layer is formed as a neutral ESL over the NMOS and PMOS gate structures. In other embodiments, the contact etch stop layer is formed as a neutral ELS over the PMOS gate structure(s) and as a tensile ESL over the NMOS gate structure(s). In still other embodiments, the contact etch stop layer is formed as a compressive ELS over the PMOS gate structure(s) and as a neutral ESL over the NMOS gate structure(s). In yet other embodiments, the contact etch stop layer is formed as a compressive ELS over the PMOS gate structure(s) and as a tensile ESL over the NMOS gate structure(s). In addition, source/drain recesses may be etched through at least the biaxially compressive semiconductor layer (and into any silicon carbide layer) and adjacent to the PMOS gate structure, and then filled by epitaxially growing silicon germanium to form embedded source/drain regions that compress the PMOS transistor channel region.

In yet another form, there is provided a semiconductor device an method for fabricating same, where the semiconductor device includes a silicon substrate having a predetermined channel orientation (e.g., <110>, <111>, or <100>) comprising a biaxially tensile semiconductor layer portion defining an NMOS active layer and a second relaxed semiconductor layer portion defining a PMOS active layer on which is formed a biaxially compressive silicon germanium layer, alone or in combination with an underlying tensile layer of silicon carbide. The semiconductor device also includes a PMOS gate structure overlying the biaxially compressive silicon germanium layer to define a PMOS transistor channel region in a portion of the biaxially compressive silicon germanium layer below the PMOS gate structure. In addition, the semiconductor device includes an NMOS gate structure overlying the biaxially tensile semiconductor layer portion of the silicon substrate to define an NMOS transistor channel region in a portion of the biaxially tensile semiconductor layer below the NMOS gate structure. Over the PMOS gate structure, a neutral or compressive contact etch stop layer may be formed. In addition, source and drain regions are formed in the substrate adjacent to the PMOS and NMOS transistor channel regions. In selected embodiments, the source/drain regions are epitaxially grown silicon germanium source/drain regions.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor fabrication process for forming a PMOS field effect transistor device, comprising:
   forming a first biaxial-tensile strained semiconductor layer;
   selectively relaxing a channel region portion of the first biaxial-tensile strained semiconductor layer where one or more PMOS transistor devices will be formed, thereby forming a PMOS active layer;
   epitaxially growing a second semiconductor layer on the PMOS active layer having a larger atom-to-atom spacing than the underlying PMOS active layer; and
   forming at least a PMOS gate structure overlying the second semiconductor layer to define a PMOS transistor channel region, the PMOS transistor channel region comprising at least a portion of the second semiconductor layer below the PMOS gate structure, the PMOS transistor channel region in the second semiconductor layer being subjected to biaxial compressive stress.

2. The process of claim 1, where forming a first biaxial-tensile strained semiconductor layer comprises forming a layer of silicon with <110>, <111>, or <100>channel orientation that exhibits biaxial tensile stress.

3. The process of claim 1, where selectively relaxing the channel region portion of the first biaxial-tensile strained semiconductor layer comprises selectively implanting the channel region portion of the first biaxial-tensile strained semiconductor layer where one or more PMOS transistor devices will be formed to relax the crystal structure of the PMOS active layer.

4. The process of claim 3, where selectively implanting the channel region portion of the first biaxial-tensile strained semiconductor layer comprises implanting silicon, germanium, carbon, or xenon into the channel region portion of the first biaxial-tensile strained semiconductor layer where one or more PMOS transistor devices will be formed.

5. The process of claim 1, where epitaxially growing a second semiconductor layer comprises epitaxially growing SiGe.

6. The process of claim 1, further comprising depositing a neutral or compressive contact etch stop layer over the PMOS gate structure.

7. The process of claim 1, further comprising:
   etching source/drain recesses through at least the second semiconductor layer and adjacent to the PMOS gate structure; and filling said source/drain recesses with embedded source/drain regions by epitaxially growing silicon germanium to compress the PMOS transistor channel region.

8. The process of claim 1, where epitaxially growing a second semiconductor layer comprises:
   epitaxially growing a layer of silicon carbide on the PMOS active layer; and
   epitaxially growing a layer of silicon germanium on the layer of silicon carbide.

9. The process of claim 8, further comprising:
   etching source/drain recesses through at least the layer of silicon carbide and the layer of silicon germanium and adjacent to the PMOS gate structure; and
   filling said source/drain recesses with embedded source/drain regions by epitaxially growing silicon germanium to compress the PMOS transistor channel region.

10. A CMOS fabrication process for forming a semiconductor integrated circuit, comprising:
    forming a first biaxial-tensile strained semiconductor layer;
    selectively masking a first portion of the first biaxial-tensile strained semiconductor layer where one or more NMOS transistor devices will be formed, thereby defining an NMOS active layer;
    selectively relaxing a second channel region portion of the first biaxial-tensile strained semiconductor layer where one or more PMOS transistor devices will be formed, thereby forming a PMOS active layer; and
    epitaxially growing a biaxially compressive semiconductor layer on the PMOS active layer and not on the NMOS active layer; and
    forming PMOS and NMOS gate structures, comprising:
      at least a PMOS gate structure overlying the biaxially compressive semiconductor layer to define a PMOS transistor channel region, the PMOS transistor channel region comprising at least a portion of the biaxially compressive semiconductor layer below the PMOS gate structure, and
      at least an NMOS gate structure overlying the NMOS active layer to define a NMOS transistor channel region in a portion of the NMOS active layer below the NMOS gate structure.

11. The CMOS fabrication process of claim 10, where selectively relaxing the second channel region portion of the first biaxial-tensile strained semiconductor layer comprises selectively implanting the second channel region portion of the first biaxial-tensile strained semiconductor layer where one or more PMOS transistor devices will be formed to relax the crystal structure of the PMOS active layer.

12. The CMOS fabrication process of claim 11, where selectively implanting the second channel region portion of the first biaxial-tensile strained semiconductor layer comprises implanting silicon or xenon into the second channel region portion of the first biaxial-tensile strained semiconductor layer where one or more PMOS transistor devices will be formed.

13. The CMOS fabrication process of claim 10, where epitaxially growing a biaxially compressive semiconductor layer comprises epitaxially growing biaxially compressive channel SiGe from the PMOS active layer.

14. The CMOS fabrication process of claim 10, further comprising forming a neutral contact etch stop layer over the NMOS and PMOS gate structures.

15. The CMOS fabrication process of claim 10, further comprising:
    forming a neutral contact etch stop layer over the PMOS gate structure; and
    forming a tensile contact etch stop layer over the NMOS gate structure.

16. The CMOS fabrication process of claim 10, further comprising:
    forming a compressive contact etch stop layer over the PMOS gate structure; and
    forming a neutral contact etch stop layer over the NMOS gate structure.

17. The CMOS fabrication process of claim 10, further comprising:
    forming a compressive contact etch stop layer over the PMOS gate structure; and
    forming a tensile contact etch stop layer over the NMOS gate structure.

18. The CMOS fabrication process of claim 10, further comprising:
    etching source/drain recesses through at least the biaxially compressive semiconductor layer and adjacent to the PMOS gate structure; and
    filling said source/drain recesses with embedded source/drain regions by epitaxially growing silicon germanium to compress the PMOS transistor channel region.

19. The CMOS fabrication process of claim 10, where epitaxially growing a biaxially compressive semiconductor layer on the PMOS active layer comprises:
    epitaxially growing a layer of silicon carbide on the PMOS active layer; and
    epitaxially growing a layer of silicon germanium on the layer of silicon carbide.

20. The process of claim 17, further comprising:
    etching source/drain recesses through at least the layer of silicon carbide and the layer of silicon germanium and adjacent to the PMOS gate structure; and
    filling said source/drain recesses with embedded source/drain regions by epitaxially growing silicon germanium to compress the PMOS transistor channel region.

* * * * *